US012581800B2

(12) United States Patent
Cao

(10) Patent No.: US 12,581,800 B2
(45) Date of Patent: Mar. 17, 2026

(54) DISPLAY PANEL AND MOBILE TERMINAL

(71) Applicant: WUHAN CHINA STAR OPTOELECTRONICS SEMICONDUCTOR DISPLAY TECHNOLOGY CO., LTD., Wuhan (CN)

(72) Inventor: Zuqiang Cao, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1090 days.

(21) Appl. No.: 17/623,870

(22) PCT Filed: Dec. 14, 2021

(86) PCT No.: PCT/CN2021/137889
§ 371 (c)(1),
(2) Date: Dec. 29, 2021

(87) PCT Pub. No.: WO2023/102968
PCT Pub. Date: Jun. 15, 2023

(65) Prior Publication Data
US 2025/0008770 A1 Jan. 2, 2025

(30) Foreign Application Priority Data

Dec. 8, 2021 (CN) .......................... 202111488808.5

(51) Int. Cl.
*H10K 59/121* (2023.01)
*H10K 59/122* (2023.01)
(Continued)

(52) U.S. Cl.
CPC ......... *H10K 59/121* (2023.02); *H10K 59/122* (2023.02); *H10K 59/126* (2023.02);
(Continued)

(58) Field of Classification Search
CPC ...... H10K 59/38; H10K 59/65; H10K 59/122; H10K 59/121; H10K 59/126; H10K 59/873
See application file for complete search history.

(56) References Cited

U.S. PATENT DOCUMENTS

2017/0098690 A1 4/2017 Lee et al.
2022/0376215 A1* 11/2022 Gao ................... H10K 59/1201

FOREIGN PATENT DOCUMENTS

CN 109817109 A 5/2019
CN 110970480 A * 4/2020
(Continued)

*Primary Examiner* — Mariceli Santiago
(74) *Attorney, Agent, or Firm* — The Roy Gross Law Firm, LLC; Roy D. Gross

(57) ABSTRACT

A display panel and a mobile terminal are provided. A shielding part is used for shielding an exposed part of a first electrode, so that most of the light entering the first electrode and being reflected can be shielded by the shielding part, the reflectivity of the display panel in a light-transmitting function sub-region is reduced, and then, the brightness in the light-transmitting function display sub-region is similar to or consistent with the brightness in a display sub-region, thereby avoiding the problem of inconsistent display brightness in the light-transmitting function display sub-region and the display sub-region in a conventional display panel.

16 Claims, 4 Drawing Sheets

(51) Int. Cl.
    *H10K 59/126*       (2023.01)
    *H10K 59/38*        (2023.01)
    *H10K 59/65*        (2023.01)
    *H10K 59/80*        (2023.01)

(52) U.S. Cl.
    CPC ............. *H10K 59/38* (2023.02); *H10K 59/65*
                  (2023.02); *H10K 59/873* (2023.02)

(56)             References Cited

FOREIGN PATENT DOCUMENTS

| | | | | | |
|---|---|---|---|---|---|
| CN | 211238258 | U | * | 8/2020 | |
| CN | 111682048 | A | | 9/2020 | |
| CN | 111739915 | A | | 10/2020 | |
| CN | 113035921 | A | | 6/2021 | |
| CN | 113113454 | A | | 7/2021 | |
| CN | 113113550 | A | | 7/2021 | |
| CN | 113327941 | A | | 8/2021 | |
| CN | 113540158 | A | | 10/2021 | |
| CN | 113725384 | A | | 11/2021 | |
| CN | 113764601 | A | | 12/2021 | |
| CN | 113764602 | A | * | 12/2021 | |
| WO | 2021136409 | A1 | | 7/2021 | |
| WO | WO-2023070408 | A1 | * | 5/2023 | ......... H10K 59/1201 |

* cited by examiner

DISPLAY PANEL AND MOBILE TERMINAL

CROSS REFERENCE TO RELATED APPLICATIONS

This application is a National Phase of PCT Patent Application No. PCT/CN2021/137889 having International filing date of Dec. 14, 2021, which claims the benefit of priority of Chinese Application No. 202111488808.5 filed on Dec. 8, 2021. The contents of the above applications are all incorporated by reference as if fully set forth herein in their entirety.

FIELD OF INVENTION

The present disclosure relates to the technical field of display, and particularly relates to a display panel and a mobile terminal.

BACKGROUND OF INVENTION

In a conventional organic light-emitting diode (OLED) display panel, a polarizer can effectively reduce the reflectivity of the panel under strong light, but loses nearly 58% of emitted light, so that the life load of the OLED display panel is greatly increased.

At present, in a conventional display panel, a color filter (CF) is usually used to replace the polarizer to solve the above problem. A display panel using a color film technology can not only realize the lightness and thinness of the display panel, but also increase a light-emitting rate of the display panel from 42% to 60%, thereby improving the contrast of the display panel.

However, due to the existence of various metal layers in the display panel, without a polarizer, in a region corresponding to a camera under the display panel, external light causes mirror reflection on the metal layers, and the reflection will cause the problem of inconsistent brightness in the region corresponding to the camera and a display region when the screen of the display panel is turned off, which seriously affects the imaging effect of the screen.

SUMMARY OF INVENTION

The embodiments of the present disclosure provide a display panel and a mobile terminal to alleviate the deficiencies in the conventional display panels and mobile terminals.

In order to solve the above technical problems, the present invention provides a display panel, including a display region. The display region includes a display sub-region and a light-transmitting function display sub-region adjacent to the display sub-region. The display panel includes:

a display panel body, including a first metal layer and an organic light-emitting layer arranged on the first metal layer, where the first metal layer includes a plurality of first electrodes located in the light-transmitting function display sub-region and arranged at intervals; and a color filter (CF), arranged on a light-emitting side of the display panel body and including a plurality of first color resistors arranged at intervals in the light-transmitting function display sub-region, where one of the first color resistors is arranged corresponding to one of the first electrodes.

The first electrode includes an overlapped part and an exposed part arranged on a peripheral side of the overlapped part, one of the first electrodes is correspondingly arranged in one of the first color resistors, and an orthographic projection of the overlapped part in a direction perpendicular to the display panel body coincides with an orthographic projection of the first color resistor in a direction perpendicular to the display panel body.

The display panel further includes a plurality of shielding parts arranged above each of the exposed parts and arranged at intervals in the light-transmitting function display sub-region, one of the shielding parts is arranged corresponding to one of the exposed parts, and an orthographic projection of one of the shielding parts in a direction perpendicular to the display panel body correspondingly covers an orthographic projection of one of the exposed parts in a direction perpendicular to the display panel body.

In a display panel provided in an embodiment of the present disclosure, the CF includes a plurality of second color resistors arranged at intervals in the display sub-region and black matrixes located between the second color resistors; and the CF includes the shielding parts, and the material of the shielding part is the same as the material of the black matrix.

In a display panel provided in an embodiment of the present disclosure, the shielding part is arranged on a peripheral side of the first color resistor; and orthographic projections of the shielding part and the first color resistor in a direction perpendicular to the display panel body cover orthographic projections of the exposed part and the overlapped part in a direction perpendicular to the display panel body.

In a display panel provided in an embodiment of the present disclosure, the shielding part has a ring-shaped structure surrounding the first color resistor.

In a display panel provided in an embodiment of the present disclosure, a distance between an inner wall and an outer wall of the shielding part having a ring-shaped structure ranges from 5 um to 10 um.

In a display panel provided in an embodiment of the present disclosure, the sum of the areas of one of the first color resistors and corresponding one of the shielding parts is less than the area of the second color resistor.

In a display panel provided in an embodiment of the present disclosure, the display panel further includes a pixel definition layer located on the metal layer, the pixel definition layer includes a plurality of opening regions, and the organic light-emitting layer is located in the opening regions; and the shielding part is arranged between the exposed part and the pixel definition layer, and the shielding part is arranged around the opening region.

In a display panel provided in an embodiment of the present disclosure, an orthographic projection of the shielding part in a direction perpendicular to the display panel body is overlapped with an orthographic projection of the exposed part in a direction perpendicular to the display panel body.

In a display panel provided in an embodiment of the present disclosure, the display panel further includes an encapsulation layer located between the CF and the organic light-emitting layer, and the encapsulation layer includes a groove part; and the shielding part is arranged in the groove part.

In a display panel provided in an embodiment of the present disclosure, the encapsulation layer includes a first encapsulation layer and a second encapsulation layer, and one of the first encapsulation layer and the second encapsulation layer includes the groove part.

An embodiment of the present disclosure provides a mobile terminal. The mobile terminal includes a terminal body and a display panel. The terminal body and the display panel are combined into a whole. The display panel includes a display region, and the display region includes a display sub-region and a light-transmitting function display sub-region adjacent to the display sub-region. The display panel includes:

a display panel body, including a first metal layer and an organic light-emitting layer arranged on the first metal layer, where the first metal layer includes a plurality of first electrodes located in the light-transmitting function display sub-region and arranged at intervals; and a color filter (CF), arranged on a light-emitting side of the display panel body and including a plurality of first color resistors arranged at intervals in the light-transmitting function display sub-region, where one of the first color resistors is arranged corresponding to one of the first electrodes.

The first electrode includes an overlapped part and an exposed part arranged on a peripheral side of the overlapped part, one of the first electrodes is correspondingly arranged in one of the first color resistors, and an orthographic projection of the overlapped part in a direction perpendicular to the display panel body coincides with an orthographic projection of the first color resistor in a direction perpendicular to the display panel body.

The display panel further includes a plurality of shielding parts arranged above each of the exposed parts and arranged at intervals in the light-transmitting function display sub-region, one of the shielding parts is arranged corresponding to one of the exposed parts, and an orthographic projection of one of the shielding parts in a direction perpendicular to the display panel body correspondingly covers an orthographic projection of one of the exposed parts in a direction perpendicular to the display panel body.

In a mobile terminal provided in an embodiment of the present disclosure, the CF includes a plurality of second color resistors arranged at intervals in the display sub-region and black matrixes located between the second color resistors; and the CF includes the shielding parts, and the material of the shielding part is the same as the material of the black matrix.

In a mobile terminal provided in an embodiment of the present disclosure, the shielding part is arranged on a peripheral side of the first color resistor; and orthographic projections of the shielding part and the first color resistor in a direction perpendicular to the display panel body cover orthographic projections of the exposed part and the overlapped part in a direction perpendicular to the display panel body.

In a mobile terminal provided in an embodiment of the present disclosure, the shielding part has a ring-shaped structure surrounding the first color resistor.

In a mobile terminal provided in an embodiment of the present disclosure, a distance between an inner wall and an outer wall of the shielding part having a ring-shaped structure ranges from 5 um to 10 um.

In a mobile terminal provided in an embodiment of the present disclosure, the sum of the areas of one of the first color resistors and corresponding one of the shielding parts is less than the area of the second color resistor.

In a mobile terminal provided in an embodiment of the present disclosure, the display panel further includes a pixel definition layer located on the metal layer, the pixel definition layer includes a plurality of opening regions, and the organic light-emitting layer is located in the opening regions; and the shielding part is arranged between the exposed part and the pixel definition layer, and the shielding part is arranged around the opening region.

In a mobile terminal provided in an embodiment of the present disclosure, an orthographic projection of the shielding part in a direction perpendicular to the display panel body is overlapped with an orthographic projection of the exposed part in a direction perpendicular to the display panel body.

In a mobile terminal provided in an embodiment of the present disclosure, the display panel further includes an encapsulation layer located between the CF and the organic light-emitting layer, and the encapsulation layer includes a groove part; and the shielding part is arranged in the groove part.

In a mobile terminal provided in an embodiment of the present disclosure, the encapsulation layer includes a first encapsulation layer and a second encapsulation layer, and one of the first encapsulation layer and the second encapsulation layer includes the groove part.

Beneficial Effects

The embodiments of the present disclosure have the following beneficial effects: the embodiments of the present disclosure provide a display panel and a mobile terminal. The display panel includes a display region, the display region includes a display sub-region and a light-transmitting function display sub-region adjacent to the display sub-region, and the display panel includes a plurality of shielding parts arranged above the exposed part of each of the first electrodes and arranged at intervals in the light-transmitting function display sub-region. The shielding part is used to shield the exposed part of the first electrode, so that most of the light entering the first electrode and being reflected can be more absorbed by the shielding part, the reflectivity of the display panel in the light-transmitting function sub-region is reduced, and then, the brightness in the light-transmitting function display sub-region is similar to or consistent with the brightness in the display sub-region, thereby avoiding the problem of inconsistent display brightness in the light-transmitting function display sub-region and the display sub-region in the conventional display panel.

BRIEF DESCRIPTION OF DRAWINGS

The following describes specific implementations of the present disclosure in detail with reference to the accompanying drawings, to make the technical solutions and other beneficial effects of the present disclosure obvious.

DETAILED DESCRIPTION OF PREFERRED EMBODIMENTS

The present disclosure provides a display panel and a mobile terminal. To make the objectives, technical solutions and the advantages of the present disclosure clearer and more comprehensible, the present disclosure is further described below in detail with reference to the accompanying drawings and embodiments. It should be understood that the specific embodiments described herein are only used to describe the present disclosure, instead of limiting the present disclosure.

Figure 1:
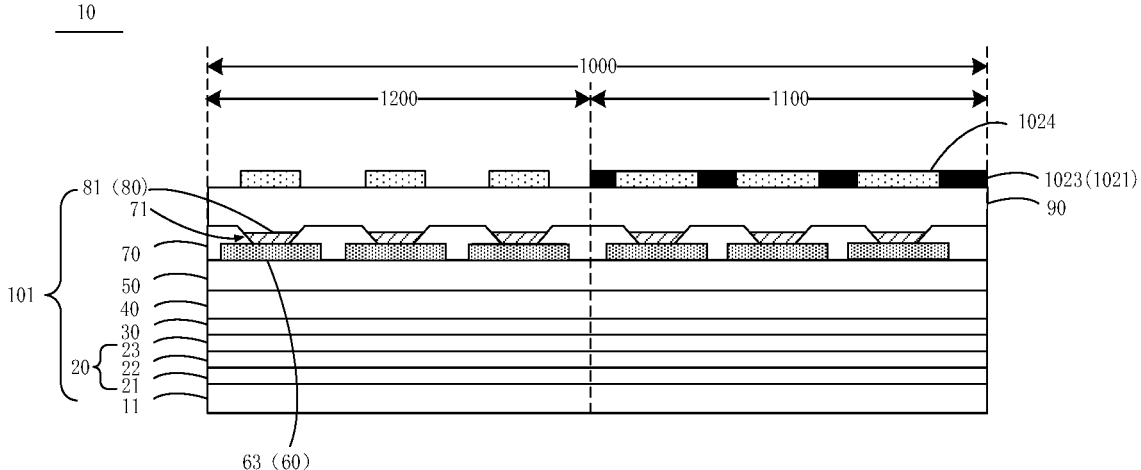
FIG. 1 is a schematic structural diagram of a conventional display panel.
Figure 2:
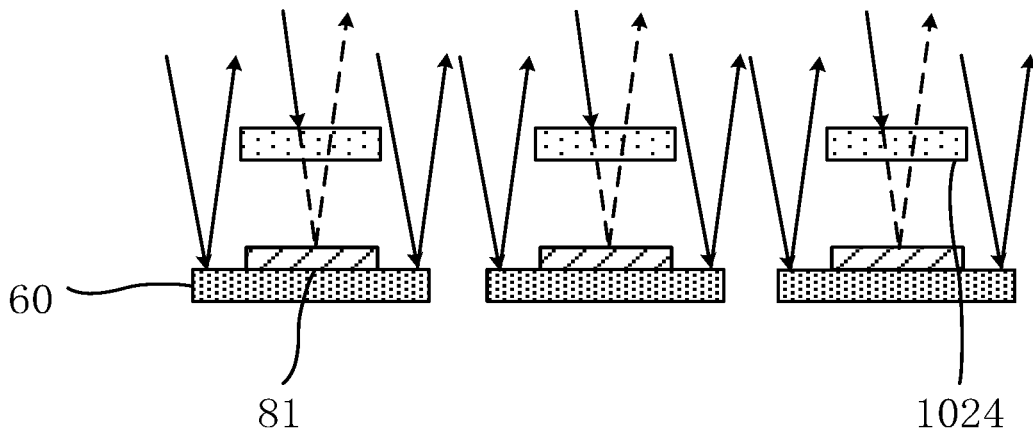
FIG. 2 is a light path diagram between first electrodes and a CF in a light-transmitting function display sub-region of a conventional display panel.

With reference to FIG. 1 and FIG. 2, FIG. 1 is a schematic structural diagram of a conventional display panel, and FIG. 2 is a light path diagram between first electrodes and a color filter (CF) in a light-transmitting function display sub-region 1200 of a conventional display panel.

A conventional display panel 10 includes a display region 1000, the display region 1000 includes a display sub-region 1100 and a light-transmitting function display sub-region 1200 adjacent to the display sub-region 1100, and the display panel 10 includes a display panel body 101 and a CF 102 arranged on a light-emitting side of the display panel body 101. The display panel body 101 includes a glass substrate 11, a base 20, a buffer layer 30, an array substrate 40, a second flat layer 50, a first metal layer 60, a pixel definition layer 70, an organic light-emitting layer 80, a touch layer (not shown in the figures) and an encapsulation layer 90 which are stacked in sequence.

The first metal layer 60 includes a plurality of electrodes 63 arranged at intervals, the pixel definition layer 70 is provided on the first metal layer 60, the pixel definition layer 70 includes a plurality of opening regions 71 exposing part of the electrodes, and the organic light-emitting layer 80 is located in the opening regions 71. Specifically, the organic light-emitting layer 80 includes a plurality of sub-pixels 81 of different colors arranged at intervals, one of the sub-pixels 81 is correspondingly arranged in one of the opening regions 71, and one of the sub-pixels 81 is arranged corresponding to one of the electrodes. The CF 102 includes a plurality of color resistors 1024 and black matrixes 1023 arranged at intervals, and one of the color resistors 1024 is arranged corresponding to one of the electrodes.

In the prior art, in order to ensure the light transmittance of the light-transmitting function sub-region 1200, the black matrixes 1023 of the CF 102 have larger openings in the light-transmitting function sub-region 1200, or orthographic projections of the black matrixes 1023 on the glass substrate 11 are located outside the light-transmitting function display sub-region 1200. However, due to the existence of the metal layer in the display panel 10, external light causes mirror reflection on the metal layer, and the reflection light will cause the problem of inconsistent brightness in the light-transmitting function sub-region 1200 and the display sub-region 1100 when the screen of the display panel 10 is turned off, which seriously affects the imaging effect of the screen. Based on this, the embodiments of the present disclosure provide a display panel and a mobile terminal to alleviate the problem of larger reflectivity in a camera under panel (CUP) of a conventional display panel.

The technical solution of the present disclosure is described in combination with specific embodiments.

Figure 3:
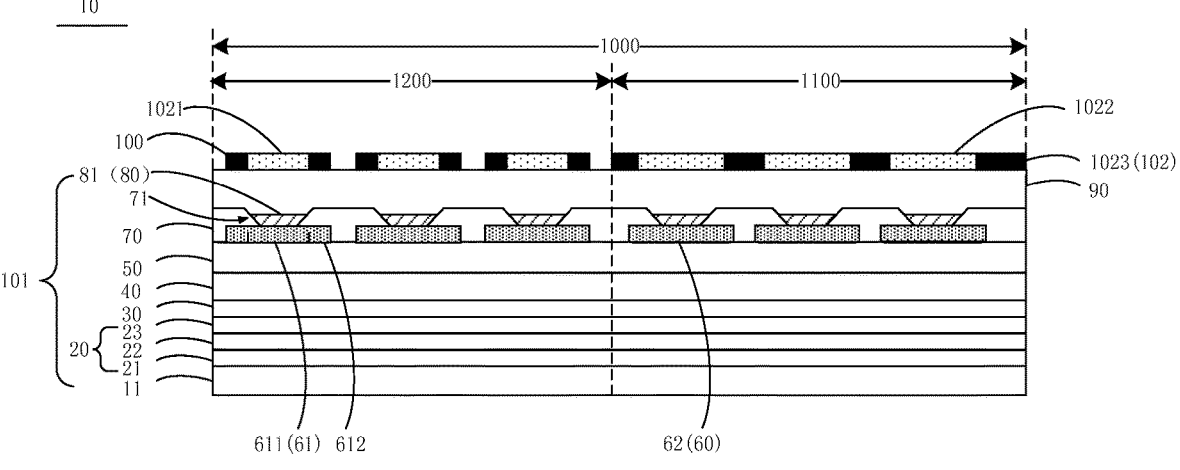
FIG. 3 is a first schematic cross-sectional diagram of a display panel provided in an embodiment of the present disclosure.
Figure 4:
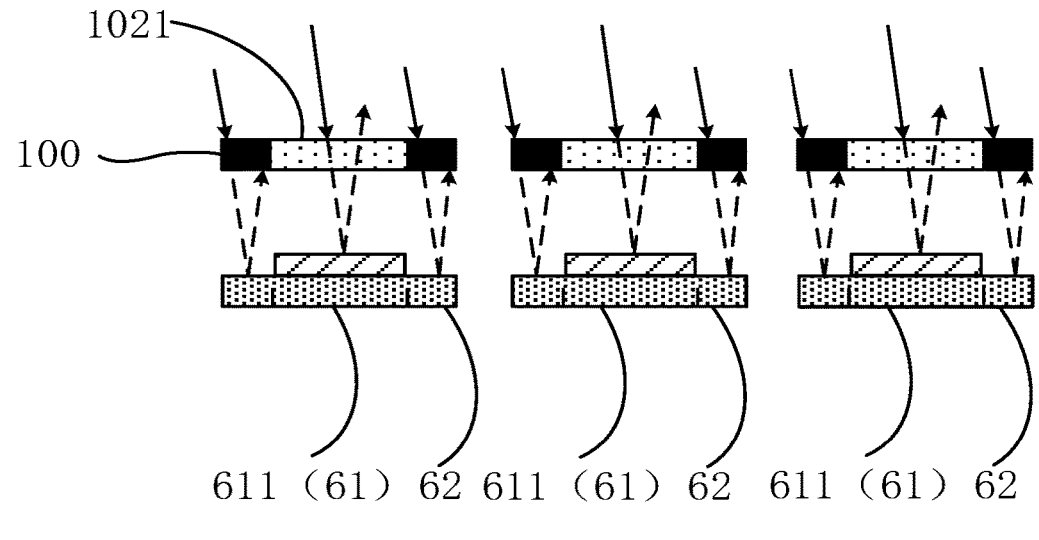
FIG. 4 is a light path diagram between first electrodes and a CF in a light-transmitting function display sub-region of a display panel provided in an embodiment of the present disclosure.

With reference to FIG. 3 and FIG. 4, FIG. 3 is a first schematic cross-sectional diagram of a display panel provided in an embodiment of the present disclosure, and FIG. 4 is a light path diagram between first electrodes and a CF in a light-transmitting function display sub-region 1200 of a display panel provided in an embodiment of the present disclosure.

This embodiment provides a display panel 10, and the display panel 10 includes, but is not limited to, an Organic Light-Emitting Diode (OLED) display panel 10, and this is not specifically limited in this embodiment. It should be noted that in this embodiment, the technical solution of the present disclosure is described by taking the display panel 10 which is an OLED display panel 10 as an example.

In this embodiment, the display panel 10 includes a display region 1000, the display region 1000 includes a display sub-region 1100 and a light-transmitting function display sub-region 1200 adjacent to the display sub-region 1100, and the display panel 10 includes a display panel body 101 and a CF 102 arranged on a light-emitting side of the display panel body 101.

The display panel body 101 includes a glass substrate 11, a base 20, a buffer layer 30, an array substrate 40, a second flat layer 50, a first metal layer 60, a pixel definition layer 70, an organic light-emitting layer 80, a touch layer (not shown in the figures) and an encapsulation layer 90 which are stacked in sequence, where the first metal layer 60 includes a plurality of electrodes arranged at intervals, and the electrodes include first electrodes 61 located in the light-transmitting function display sub-region 1200 and second electrodes 62 located in the display sub-region 1100.

The base 20 includes a first substrate 21, a spacer layer 22 and a second substrate 23 which are stacked in sequence, where both the first substrate 21 and the second substrate 23 may include a rigid substrate or a flexible substrate. When both the first substrate 21 and the second substrate 23 are rigid substrates, the material may be metal or glass. When both the first substrate 21 and the second substrate 23 are flexible substrates, the material may include at least one of acrylic resin, methacrylic resin, polyisoprene, vinyl resin, epoxy resin, polyurethane resin, cellulosic resin, siloxane resin, polyimide resin and polyamide resin. The material of the spacer layer 22 includes, but is not limited to, materials with water absorbency, such as silicon nitride (SiNx) and silicon oxide (SiOx). In this embodiment, the materials of the first substrate 21, the second substrate 23 and the spacer layer 22 are not limited.

The material of the first metal layer 60 includes at least one of molybdenum (Mo), aluminum (Al), platinum (Pt), palladium (Pd), argentum (Ag), magnesium (Mg), aurum (Au), nickel (Ni), neodymium (Nd), iridium (Ir), chromium (Cr), calcium (Ca), titanium (Ti), tantalum (Ta) and tungsten (W). In this embodiment, the material of the first metal layer 60 is not limited.

It should be noted that in this embodiment, the light-transmitting function display sub-region 1200 includes, but is not limited to, a CUP, and the electrode includes, but is not limited to, a positive electrode. In this embodiment, the technical solution of the present disclosure is described by taking the light-transmitting function display sub-region 1200 which is a CUP and the electrode which is a positive electrode as an example.

In this embodiment, the pixel definition layer 70 is provided on the first metal layer 60, the pixel definition layer 70 includes a plurality of opening regions 71 exposing part of the electrodes, and the organic light-emitting layer 80 is located in the opening regions 71. Specifically, the organic light-emitting layer 80 includes a plurality of sub-pixels 81 of different colors arranged at intervals, one of the sub-pixels 81 is correspondingly arranged in one of the opening regions 71, and one of the sub-pixels 81 is arranged corresponding to one of the electrodes. The sub-pixels 81 include, but are not limited to, red sub-pixels, green sub-pixels and blue sub-pixels.

The CF 102 includes a plurality of color resistors and black matrixes 1023 arranged at intervals, and one of the color resistors is arranged corresponding to one of the electrodes. It should be noted that in this embodiment, the CF 102 is located above the organic light-emitting layer 80; the color resistors at least include red color resistors, green color resistors and blue color resistors; and the red color resistors are arranged corresponding to the red sub-pixels, the green color resistors are arranged corresponding to the green sub-pixels, and the blue color resistors are arranged corresponding to the blue sub-pixels, thereby realizing a visual aesthetic effect of an integrated black display panel 10.

Further, the color resistors include first color resistors 1021 and second color resistors 1022, the first color resistors 1021 are located in the light-transmitting function display sub-region 1200, the second color resistors 1022 are located in the display sub-region 1100, and the black matrixes 1023 are located between the second color resistors 1022 to define the boundary between the second color resistors 1022. Further, in order to prevent light leakage between adjacent second color resistors 1022, the edges of the second color resistors 1022 are usually overlapped on the black matrixes 1023.

In this embodiment, the first electrode 61 includes an overlapped part 611 and an exposed part 612 arranged on a peripheral side of the overlapped part 611, one of the first electrodes 61 is correspondingly arranged in one of the first color resistors 1021, an orthographic projection of the overlapped part 611 in a direction perpendicular to the display panel body 101 coincides with an orthographic projection of the first color resistor 1021 in a direction perpendicular to the display panel body 101, and an orthographic projection of the exposed part 612 in a direction perpendicular to the display panel body 101 does not coincide with an orthographic projection of the first color resistor 1021 in a direction perpendicular to the display panel body 101.

The display panel 10 further includes a plurality of shielding parts 100 arranged above each of the exposed parts 612 and arranged at intervals in the light-transmitting function display sub-region 1200, one of the shielding parts 100 is arranged corresponding to one of the exposed parts 612, and an orthographic projection of one of the shielding parts 100 in a direction perpendicular to the display panel body 101 correspondingly covers an orthographic projection of one of the exposed parts 612 in a direction perpendicular to the display panel body 101.

It should be noted that in this embodiment, the projection of the first color resistor 1021 is overlapped with the first electrode 61 to form an overlapped region (not marked in the figures). In this embodiment, the part located in the overlapped region in the first electrode 61 serves as the overlapped part 611, and the part excluding the overlapped part 611 in the first electrode 61 serves as the exposed part 612, where the external light entering the overlapped part 611 is filtered by the first color resistor 1021, and the external light entering the exposed part 612 is filtered by the shielding part 100.

It can be understood that in this embodiment, one of the shielding parts 100 is arranged corresponding to one of the exposed parts 612, and an orthographic projection of one of the shielding parts 100 in a direction perpendicular to the display panel body 101 correspondingly covers an orthographic projection of one of the exposed parts 612 in a direction perpendicular to the display panel body 101, so that most of the external light entering the first electrode 61 and being reflected can be more shielded by the shielding part 100, the reflectivity of the display panel 10 in the light-transmitting function display sub-region 1200 is reduced, and then, the brightness in the light-transmitting function display sub-region 1200 is similar to or consistent with the brightness in the display sub-region 1100, thereby avoiding the problem of inconsistent display brightness in the light-transmitting function display sub-region 1200 and the display sub-region 1100 in the conventional display panel 10.

In this embodiment, the CF 102 includes the shielding parts 100, and the material of the shielding part 100 is the same as the material of the black matrix 1023. It can be understood that the material of the black matrix 1023 has a light-shielding property, the material of the shielding part 100 is the same as the material of the black matrix 1023, one of the shielding parts 100 is arranged corresponding to one of the exposed parts 612, and an orthographic projection of one of the shielding parts 100 in a direction perpendicular to the display panel body 101 correspondingly covers an orthographic projection of one of the exposed parts 612 in a direction perpendicular to the display panel body 101, thereby preventing external light from causing mirror reflection on the first electrode 61 to enable the brightness in the light-transmitting function display sub-region 1200 to be similar to or consistent with the brightness in the display sub-region 1100. Furthermore, in this embodiment, the CF 102 includes the shielding parts 100, and the material of the shielding part 100 is the same as the material of the black matrix 1023, so that the shielding part 100 and the black matrix 1023 can be prepared through an illuminating process, which saves the cost of a preparation process of the display panel 10.

Further, in this embodiment, the shielding part 100 is arranged on a peripheral side of the first color resistor 1021, and orthographic projections of the shielding part 100 and the first color resistor 1021 in a direction perpendicular to the display panel body 101 cover orthographic projections of the exposed part 612 and the overlapped part 611 in a direction perpendicular to the display panel body 101.

Figures 5, 6:
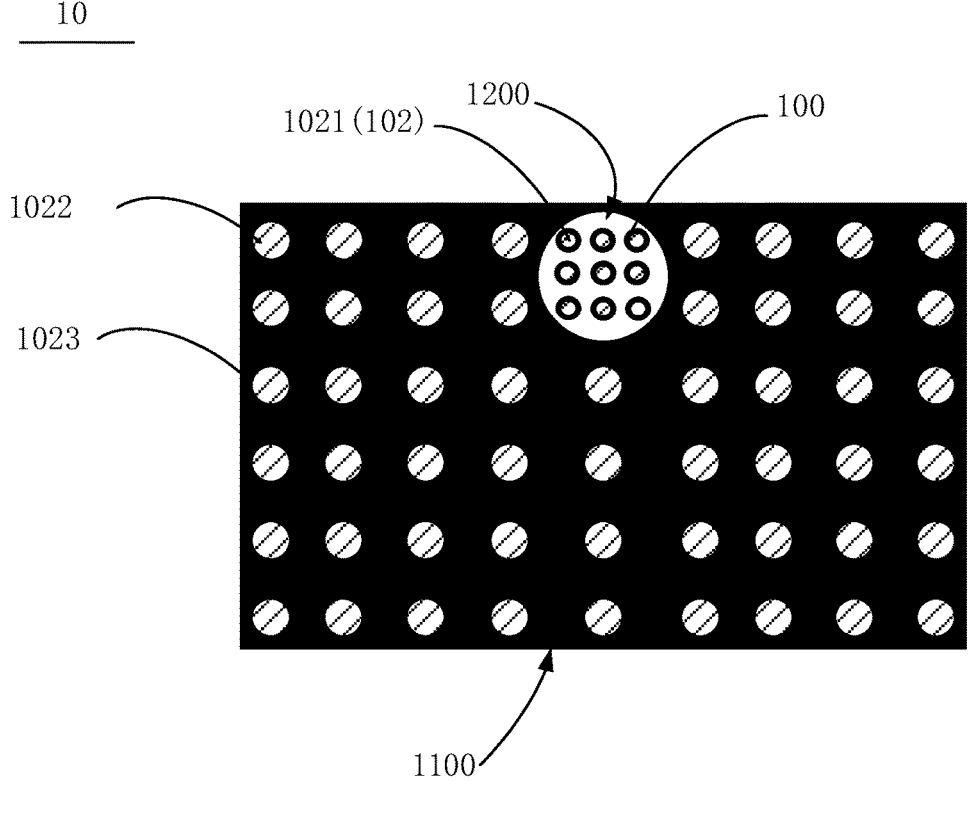
FIG. 5 is a partial top view of a display panel provided in this embodiment of the present disclosure.
FIG. 6 is a second schematic cross-sectional diagram of a display panel provided in an embodiment of the present disclosure.

Based on the above, please refer to FIG. 5, which is a partial top view of a display panel provided in this embodiment.

In this embodiment, the shielding part 100 has a ring-shaped structure surrounding the first color resistor 1021. It can be understood that considering that after the external light enters the first electrode 61, the light will be reflected from each region in the light-transmitting function display sub-region 1200, in this embodiment, by setting the shielding part 100 to have a ring-shaped structure surrounding the first color resistor 1021, the reflected light in all directions can be shielded by the shielding part 100, so that the brightness in the light-transmitting function display sub-region 1200 is similar to or consistent with the brightness in the display sub-region 1100.

In this embodiment, the sum of the areas of one of the first color resistors 1021 and corresponding one of the shielding parts 100 is less than the area of the second color resistor 1022, and further, a distance between an inner wall and an outer wall of the shielding part having a ring-shaped structure ranges from 5 um to 10 um. It can be understood that in this embodiment, the light-transmitting function display sub-region 1200 may be a CUP, and a distance between an inner wall and an outer wall of the shielding part having a ring-shaped structure is set to less than 10 um, so as to prevent the shielding part 100 from affecting the light transmittance of the light-transmitting function display sub-region 1200. Meanwhile, in this embodiment, a distance between an inner wall and an outer wall of the shielding part having a ring-shaped structure is set to greater than 5 um, so as to furthest meet that an orthographic projection of one of the shielding parts 100 in a direction perpendicular to the display panel body 101 correspondingly covers an orthographic projection of one of the exposed parts 612 in a direction perpendicular to the display panel body 101.

In this embodiment, a thickness of the shielding part 100 is 1 um-2 um. It should be noted that the thickness of the shielding part 100 will affect its shielding effect. Generally, when an optical density value of the shielding part 100 is greater than 3, the shielding part 100 can be displayed as black so as to achieve the same effect as the black matrix 1023. Therefore, the optical density value of the shielding part 100 can be controlled by adjusting the thickness of the shielding part 100 to improve the shielding effect. In this embodiment, by setting the thickness of the shielding part 100 to be 1 um-2 um, the shielding effect of the shielding part is met, furthermore, the impact of the overall thickness of the display panel 10 is also avoided, and the lightness and thinness of the display panel 10 are maintained.

It can be understood that the distance between the inner wall and the outer wall of the shielding part having a ring-shaped structure and the thickness of the shielding part 100 can be limited according to actual requirements, and are not specifically limited in this embodiment.

Please refer to FIG. 6, which is a second schematic cross-sectional diagram of a display panel 10 provided in an embodiment of the present disclosure.

In this embodiment, the structure of the display panel 10 is similar to or the same as the first structure of the display panel 10 provided in the above embodiment, and specific descriptions refer to the descriptions of the display panel 10 in the above embodiment and are not repeated here. The differences between the two display panels are:

In this embodiment, the shielding part 100 is arranged between the exposed part 612 and the pixel definition layer 70, and the shielding part 100 is arranged around the opening region 71. Further, an orthographic projection of the shielding part 100 in a direction perpendicular to the display panel body 101 is overlapped with an orthographic projection of the exposed part 612 in a direction perpendicular to the display panel body 101.

It can be understood that compared with the above embodiment in which the CF 102 includes the shielding parts 100, in this embodiment, the shielding part 100 is arranged between the exposed part 612 and the pixel definition layer 70, that is, the shielding part 100 is adjacent to the exposed part 612 of the first electrode 61, and an orthographic projection of the shielding part 100 in a direction perpendicular to the display panel body 101 is overlapped with an orthographic projection of the exposed part 612 in a direction perpendicular to the display panel body 101, so that the shielding part 100 covers the exposed part 612 in a completely overlapped manner. As a result, the reflection effect of the first electrode 61 on the external light can be effectively alleviated, and the reflectivity of the display panel 10 in the light-transmitting function display sub-region 1200 can be reduced, so as to ensure that the display brightness in the light-transmitting function display sub-region 1200 is similar to or consistent with the display brightness in the display sub-region 1100. Meanwhile, the shielding part 100 is arranged around the opening region 71, thereby preventing the shielding part 100 from shielding the organic light-emitting layer 80 and affecting the light-emitting brightness of the display panel 10.

Figure 7:
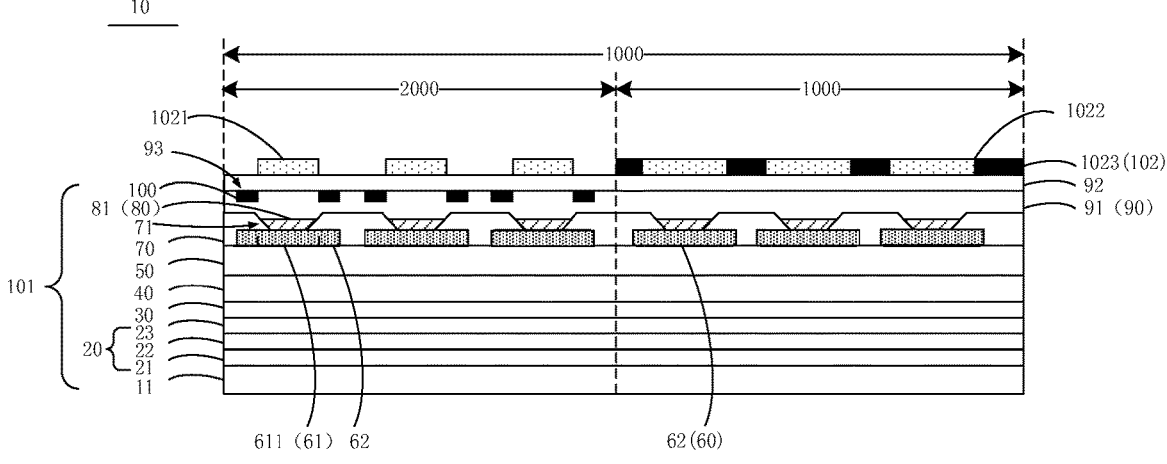
FIG. 7 is a third schematic cross-sectional diagram of a display panel provided in an embodiment of the present disclosure.

Please refer to FIG. 7, which is a third schematic cross-sectional diagram of a display panel 10 provided in an embodiment of the present disclosure.

In this embodiment, the structure of the display panel 10 is similar to or the same as the first structure of the display panel 10 provided in the above embodiment, and specific descriptions refer to the descriptions of the display panel 10 in the above embodiment and are not repeated here. The differences between the two display panels are:

In this embodiment, the encapsulation layer 90 includes a groove part 93, and the shielding parts 100 are arranged in the groove part 93.

Specifically, in this embodiment, the encapsulation layer 90 includes, but is not limited to, a first encapsulation layer 91 and a second encapsulation layer 92, the first encapsulation layer 91 includes, but is not limited to, an organic encapsulation layer, and the second encapsulation layer 92 includes, but is not limited to, an inorganic encapsulation layer, where one of the first encapsulation layer 91 and the second encapsulation layer 92 includes the groove part 93. Further, in this embodiment, the technical solution of the present disclosure is illustrated by taking the first encapsulation layer 91 which includes the groove part 93 as an example.

It should be noted that in this embodiment, the second encapsulation layer 92 is located on the first encapsulation layer 91 and the shielding part 100 and covers the first encapsulation layer 91 and the shielding part 100.

In this embodiment, by arranging the groove part 93 on the first encapsulation layer 91 and arranging the shielding parts 100 in the groove part 93, the reflectivity of the display panel 10 in the light-transmitting function display sub-region 1200 is reduced to ensure that the display brightness in the light-transmitting function display sub-region 1200 is similar to or consistent with the display brightness in the display sub-region 1100. Meanwhile, the groove is arranged in the encapsulation layer 90 of the display panel body 101 to avoid the impact on the overall thickness of the display panel 10 after the shielding parts 100 are arranged on the display panel body 101, thereby maintaining the lightness and thinness of the display panel 10. Moreover, by enabling the second encapsulation layer 92 to cover the first encapsulation layer 91 and the shielding parts 100, the encapsulation layer 90 can have a corresponding encapsulation effect.

It can be understood that in the above embodiment, the CF 102 includes the shielding parts 100, the shielding part 100 is arranged between the exposed part 612 and the pixel definition layer 70, and the shielding parts 100 are arranged in the groove part 93, which are only used to illustrate the technical means of the present disclosure. In this embodiment, the position of the shielding part 100 is not specifically limited.

Figure 8:
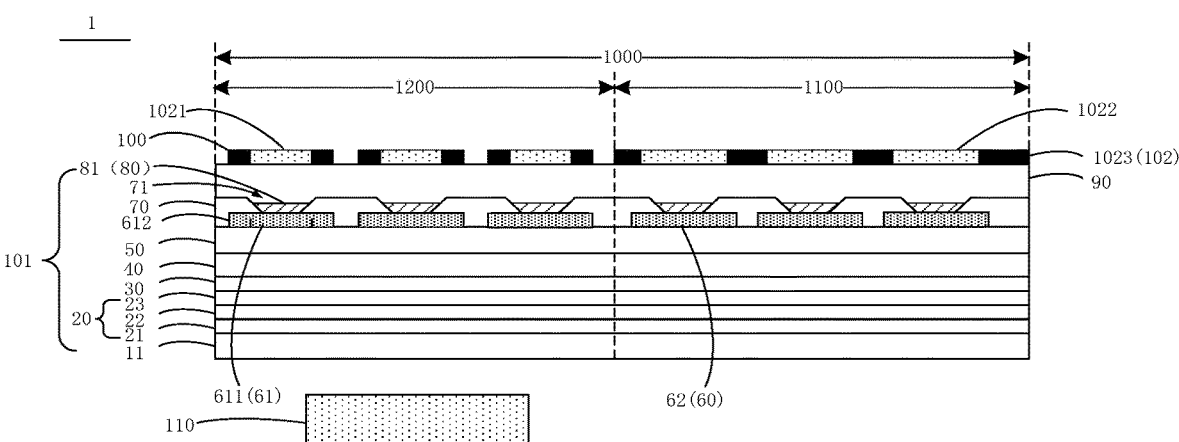
FIG. 8 is a schematic cross-sectional diagram of a display device provided in an embodiment of the present disclosure.

Please refer to FIG. 8, which is a schematic cross-sectional diagram of a display device provided in an embodiment of the present disclosure.

This embodiment provides a display device 1. The display device 1 includes the display panel 10 in any one of the above embodiments, and a camera 110, where the camera 110 is corresponding to the light-transmitting function display sub-region 1200, and the camera is located on one side of the display panel body 101 away from the CF 102.

In this embodiment, the technical solution of the present disclosure is illustrated by taking the CF 102 which includes the shielding parts 100 as an example.

It can be understood that the display panel 10 has been described in detail in the above embodiments, and the description will not be repeated here.

This embodiment provides a mobile terminal, the mobile terminal includes a terminal body and the display panel described in any one of the above embodiments, and the terminal body and the display panel are combined into a whole.

It can be understood that the display panel has been described in detail in the above embodiments, and the description will not be repeated here.

In specific disclosures, the mobile terminal may be a display screen of a smartphone, a tablet computer, a notebook computer, a smart bracelet, a smart watch, smart glasses, a smart helmet, a desktop computer, a smart television, or a digital camera, and the like, and even can be applied to an electronic device with a flexible display screen.

In conclusion, the present disclosure provides a display panel and a mobile terminal. The display panel includes a display sub-region and a light-transmitting function display sub-region adjacent to the display sub-region. The display panel includes a display panel body and a CF arranged on a light-emitting side of the display panel body. The display panel body includes a first metal layer and an organic light-emitting layer which are stacked. The first metal layer includes a plurality of first electrodes located in the light-transmitting function display sub-region and arranged at intervals. The CF includes a plurality of first color resistors located in the light-transmitting function display sub-region, and one of the first color resistors is arranged corresponding to one of the first electrodes. The first electrode includes an overlapped part and an exposed part arranged on a peripheral side of the overlapped part, one of the first electrodes is correspondingly arranged in one of the first color resistors, and an orthographic projection of the overlapped part in a direction perpendicular to the display panel body coincides with an orthographic projection of the first color resistor in a direction perpendicular to the display panel body. The display panel includes a plurality of shielding parts arranged above each of the exposed parts and arranged at intervals in the light-transmitting function display sub-region, one of the shielding parts is arranged corresponding to one of the exposed parts, and an orthographic projection of one of the shielding parts in a direction perpendicular to the display panel body correspondingly covers an orthographic projection of one of the exposed parts in a direction perpendicular to the display panel body. The shielding part is used to shield the exposed part of the first electrode to avoid the reflection effect of the first electrode on the external light, and then, the brightness in the light-transmitting function display sub-region is similar to or consistent with the brightness in the display sub-region, thereby avoiding the problem of inconsistent display brightness in the light-transmitting function display sub-region and the display sub-region in the conventional display panel.

It is to be understood that to a person of ordinary skill in the art, equivalent substitutions or changes may be made according to the technical solution of the present disclosure and its inventive concept, and all such changes or substitutions shall fall within the scope of protection of the claims appended to the present disclosure.

What is claimed is:

1. A display panel, comprising a display region, wherein the display region comprises a display sub-region and a light-transmitting function display sub-region adjacent to the display sub-region, and the display panel comprises:

a display panel body, comprising a first metal layer and a pixel definition layer and an organic light-emitting layer that are arranged on the first metal layer, wherein the first metal layer comprises a plurality of first electrodes located in the light-transmitting function display sub-region and arranged at intervals; and a color filter (CF), arranged on a light-emitting side of the display panel body and comprising a plurality of first color resistors arranged at intervals in the light-transmitting function display sub-region, wherein one of the first color resistors is arranged corresponding to one of the first electrodes, wherein the first electrode comprises an overlapped part and an exposed part arranged on a peripheral side of the overlapped part, one of the first electrodes is correspondingly arranged in one of the first color resistors, and an orthographic projection of the overlapped part in a direction perpendicular to the display panel body coincides with an orthographic projection of the first color resistor in a direction perpendicular to the display panel body; and the display panel further comprises a plurality of shielding parts arranged above each of the exposed parts and arranged at intervals in the light-transmitting function display sub-region, the shielding parts are arranged in one-to-one correspondence with the exposed parts, and an orthographic projection of one of the shielding parts in a direction perpendicular to the display panel body correspondingly covers an orthographic projection of one of the exposed parts in a direction perpendicular to the display panel body, at least one of the shielding parts is arranged between a corresponding one of the exposed parts and the pixel definition layer along the direction perpendicular to the display panel body, so that a lower surface of the shielding part is in contact with an upper surface of the exposed part.

2. The display panel as claimed in claim 1, wherein the CF comprises a plurality of second color resistors arranged at intervals in the display sub-region and black matrixes located between the second color resistors; and wherein the CF comprises the shielding parts, and a material of the shielding parts is the same as a material of the black matrix.

3. The display panel as claimed in claim 2, wherein orthographic projections of the shielding part and the first color resistor in a direction perpendicular to the display panel body cover orthographic projections of the exposed part and the overlapped part in a direction perpendicular to the display panel body.

4. The display panel as claimed in claim 3, wherein the shielding part has a ring-shaped structure surrounding the first color resistor.

5. The display panel as claimed in claim 4, wherein a distance between an inner wall and an outer wall of the shielding part having a ring-shaped structure ranges from 5 um to 10 um.

6. The display panel as claimed in claim 3, wherein a sum of areas of one of the first color resistors and corresponding one of the shielding parts is less than area of the second color resistor.

7. The display panel as claimed in claim 1, wherein the pixel definition layer comprises a plurality of opening regions, and the organic light-emitting layer is located in the opening regions; and wherein the shielding part is arranged around the opening region.

8. The display panel as claimed in claim 7, wherein an orthographic projection of the shielding part in a direction perpendicular to the display panel body is overlapped with an orthographic projection of the exposed part in a direction perpendicular to the display panel body.

9. A mobile terminal, comprising a terminal body and a display panel, wherein the terminal body and the display panel are combined as a whole, the display panel comprises a display region, the display region comprises a display sub-region and a light-transmitting function display sub-region adjacent to the display sub-region, and the display panel comprises:

a display panel body, comprising a first metal layer and a pixel definition layer and an organic light-emitting layer that are arranged on the first metal layer, wherein the first metal layer comprises a plurality of first electrodes located in the light-transmitting function display sub-region and arranged at intervals; and a color filter (CF), arranged on a light-emitting side of the display panel body and comprising a plurality of first color resistors arranged at intervals in the light-transmitting function display sub-region, wherein one of the first color resistors is arranged corresponding to one of the first electrodes, wherein the first electrode comprises an overlapped part and an exposed part arranged on a peripheral side of the overlapped part, one of the first electrodes is correspondingly arranged in one of the first color resistors, and an orthographic projection of the overlapped part in a direction perpendicular to the display panel body coincides with an orthographic projection of the first color resistor in a direction perpendicular to the display panel body; and the display panel further comprises a plurality of shielding parts arranged above each of the exposed parts and arranged at intervals in the light-transmitting function display sub-region, the shielding parts is are arranged in one-to-one correspondence with the exposed parts, and an orthographic projection of one of the shielding parts in a direction perpendicular to the display panel body correspondingly covers an orthographic projection of one of the exposed parts in a direction perpendicular to the display panel body, at least one of the shielding parts is arranged between a corresponding one of the exposed parts and the pixel definition layer along the direction perpendicular to the display panel body, so that a lower surface of the shielding part is in contact with an upper surface of the exposed part.

10. The mobile terminal as claimed in claim 9, wherein the CF comprises a plurality of second color resistors arranged at intervals in the display sub-region and black matrixes located between the second color resistors; and wherein the CF comprises the shielding parts, and a material of the shielding parts is the same as a material of the black matrix.

11. The mobile terminal as claimed in claim 10, wherein orthographic projections of the shielding part and the first color resistor in a direction perpendicular to the display panel body cover orthographic projections of the exposed part and the overlapped part in a direction perpendicular to the display panel body.

12. The mobile terminal as claimed in claim 11, wherein the shielding part has a ring-shaped structure surrounding the first color resistor.

13. The mobile terminal as claimed in claim 12, wherein a distance between an inner wall and an outer wall of the shielding part having a ring-shaped structure ranges from 5 um to 10 um.

14. The mobile terminal as claimed in claim 11, wherein a sum of areas of one of the first color resistors and corresponding one of the shielding parts is less than area of the second color resistor.

15. The mobile terminal as claimed in claim 9, wherein the pixel definition layer comprises a plurality of opening regions, and the organic light-emitting layer is located in the opening regions; and the shielding part is arranged around the opening region.

16. The mobile terminal as claimed in claim 15, wherein an orthographic projection of the shielding part in a direction perpendicular to the display panel body is overlapped with an orthographic projection of the exposed part in a direction perpendicular to the display panel body.

* * * * *